United States Patent [19]

Takano et al.

[11] Patent Number: 5,721,490

[45] Date of Patent: Feb. 24, 1998

[54] POWER SOURCE APPARATUS INCLUDING A PLURALITY OF OUTPUT CURRENT AMPLIFIERS CONNECTED IN PARALLEL AND MRI APPARATUS USING THE SAME

[75] Inventors: Hiroshi Takano, Ibaraki-ken; Hiroyuki Takeuchi, Kashiwa; Keiichi Chabata, Kashiwa; Takuya Domoto, Kashiwa; Takanobu Hatakeyama, Ryugasaki, all of Japan

[73] Assignee: Hitachi Medical Corporation, Tokyo, Japan

[21] Appl. No.: 597,959

[22] Filed: Feb. 7, 1996

[30] Foreign Application Priority Data

Feb. 9, 1995 [JP] Japan ................................. 7-021989

[51] Int. Cl.$^6$ ........................................ G01V 3/00
[52] U.S. Cl. ............................. 324/322; 128/653.5
[58] Field of Search ........................ 324/318, 322, 324/307, 309; 128/653.5; 335/296, 299

[56] References Cited

U.S. PATENT DOCUMENTS

| | | | |
|---|---|---|---|
| 5,017,871 | 5/1991 | Mueller et al. | 324/318 |
| 5,063,349 | 11/1991 | Roener et al. | 324/318 |
| 5,066,914 | 11/1991 | Vaurek et al. | 324/322 |
| 5,105,153 | 4/1992 | Mueller et al. | 324/322 |
| 5,235,281 | 8/1993 | Haragarshira et al. | 324/318 |
| 5,245,287 | 9/1993 | Nowak et al. | 324/322 |
| 5,270,657 | 12/1993 | Wirth et al. | 324/322 |
| 5,311,136 | 5/1994 | Takahashi | 324/318 |

FOREIGN PATENT DOCUMENTS 647015  6/1994  Japan.

Primary Examiner—Louis M. Arana
Attorney, Agent, or Firm—Antonelli, Terry, Stout & Kraus, LLP

[57] ABSTRACT

A power source apparatus distributes a current command value to be supplied to a load to a plurality of output current amplifiers connected in parallel with the load, and each of the output current amplifiers supplies an output current corresponding to the current command value so distributed. This power source apparatus prevents a circulating current between the output current amplifiers by controlling each output current amplifier so that the difference between the output current from each output current amplifier and the distributed current command value becomes zero, or by inserting current limiting devices into the output line of each output current amplifier.

33 Claims, 11 Drawing Sheets

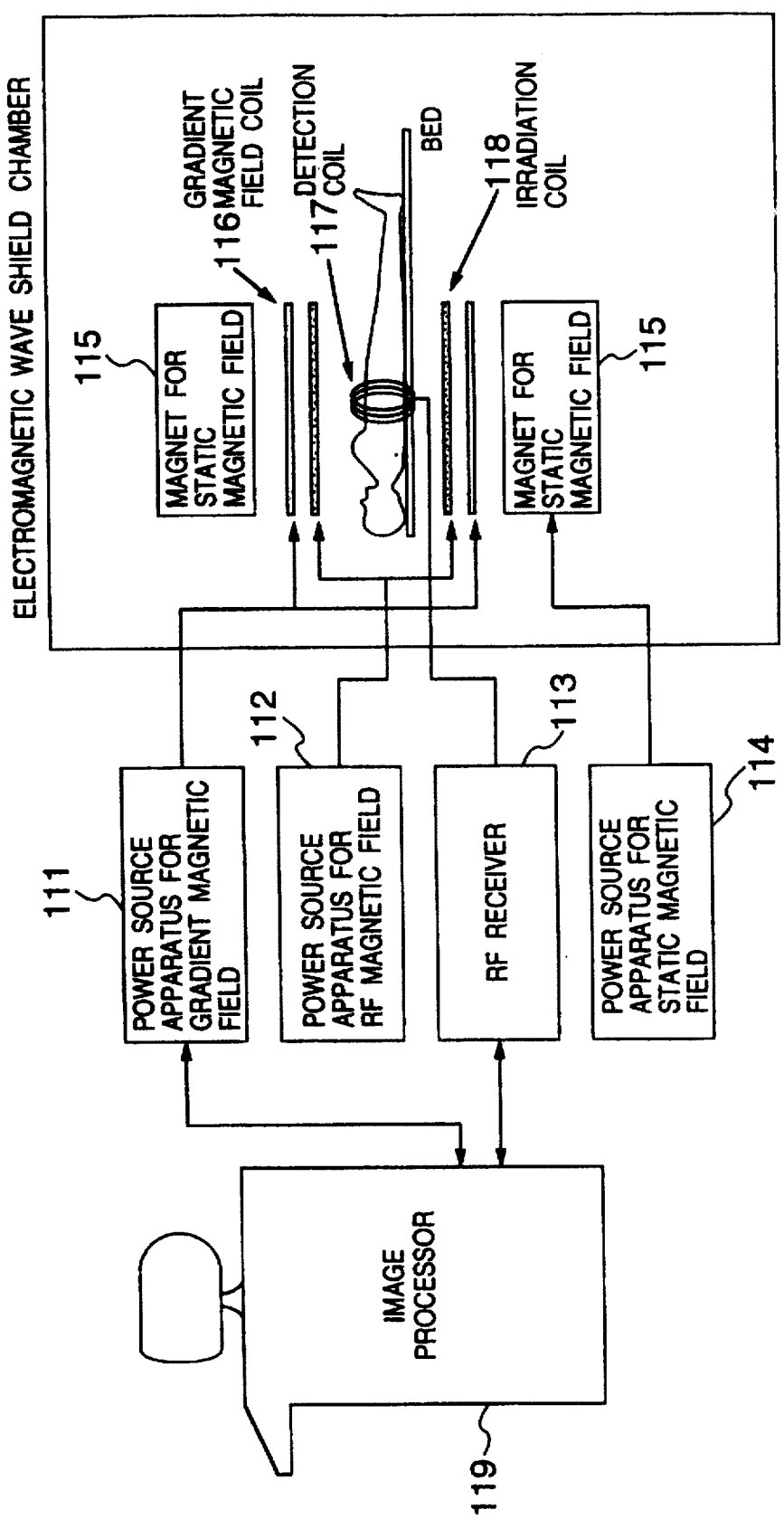

POWER SOURCE APPARATUS INCLUDING A PLURALITY OF OUTPUT CURRENT AMPLIFIERS CONNECTED IN PARALLEL AND MRI APPARATUS USING THE SAME

BACKGROUND OF THE INVENTION

This invention relates to a power source apparatus which can be suitably used for a magnetic field generating coil of a magnetic resonance imaging apparatus (hereinafter referred to as an "MRI" apparatus), or the like. More particularly, the present invention relates to a power source apparatus suitable for various power sources necessary for generating a static magnetic field, a gradient magnetic field and a radio frequency magnetic field that require large power.

The MRI apparatus applies a radio frequency magnetic field in the pulse form to an inspection object placed inside a static magnetic field, detects nuclear magnetic resonance signals generated from the inspection object and reconstructs a spectrum or an image on the basis of the detection signals. The MRI apparatus include, as field generating coils, a superconducting or normal conducting coil for generating a static magnetic field, a gradient magnetic field coil for generating a gradient magnetic field overlapped with the static magnetic field, and a radio frequency (RF) coil for generating an RF magnetic field. These field generating coils include a power source apparatus for controlling the magnitude of an impressed voltage and its timing in order to generate the magnetic field having a predetermined field intensity.

An example of the power source apparatus of the field generating coil of the MRI apparatus is shown in FIG. 1 of the accompanying drawings. The power source apparatus 1 comprises an output current amplifier 2 which inputs a current command from a sequencer (not shown) for generating the current command to be applied to a magnetic field coil 200 and outputs a corresponding output current to the magnetic field coil 200. Besides linear amplifiers comprising an analog circuit such as a power amplifier in which the input and the output have a proportional relationship, switching system output current amplifiers comprising switching devices such as transistors connected in the bridge circuit and a system comprising the combination of the switching devices with passive devices for resonance are used as the output current amplifier 2. The latter two are referred to as "switching power sources", and an RF alternating current can be obtained.

FIG. 2 shows particularly the circuit construction of the switching power source for generating the gradient magnetic field among the switching power sources for generating the magnetic fields of the MRI apparatus. This switching power source 3 includes four switching devices 51 to 54, reactors 55 and 56 capacitors 57 and 58 for smoothing the output of the switching power source. The switching devices 51 and 52 and the switching devices 53 and 54 are connected in series with a D.C. power source 50, respectively, and the switching devices 51 and 52 and the switching devices 53 and 54 are connected in parallel with one another. The reactor 55 and the capacitor 57 are connected in parallel with the switching device 52 while the reactor 56 and the capacitor 58 are connected in parallel with the switching device 54, and they constitute smoothing circuits for smoothing the voltages VL, VR on the drain side of the switches 52 and 54, respectively. One of the output terminals of this switching power source 3 is connected to the junction between the reactor 55 and the capacitor 57 while the other output terminal is connected to the junction between the reactor 56 and the capacitor 58.

The switching power source 3 is alternately driven in a predetermined cycle so that the switches 52 and 53 are turned off when the switches 51 and 54 are turned off and the switches 52 and 53 are turned on when the switches 51 and 54 are turned off. In this instance, if the ON time of the switches 51 and 54 is set to be long and the ON time of the switches 52 and 53 is set to be short, for example, the voltages VL and VR on the drain side of the switches 52 and 54, as viewed from the neutral point (not shown) of the D.C. power source 50 describe the waveforms as shown in FIG. 3. As these waveforms are smoothed by the reactor 55 and the capacitor 57 and by the reactor 56 and the capacitor 58, respectively, the voltages VLA and VRA at the output terminals become the D.C. voltages and eventually, a D.C. current IL is supplied to the gradient magnetic field coil.

Field effect transistors (MOSFETs) having a withstand voltage in the order of hundreds of volts and a current capacity in the order of dozens of amperes and capable of RF switching of hundreds of kHz are generally used as the switching devices 51 to 55 of the switching power source.

In the MRI apparatus, the field intensity of the static magnetic field, the gradient magnetic field and the RF magnetic field greatly affects the noise on the image finally obtained and the imaging time, and in order to obtain images useful for diagnosis within a short time, a large current source is necessary as the field power source of the MRI apparatus. A power source apparatus having a switch withstand voltage of about 1,200 V and an output current of from about 400 to about 600 A is necessary for such an MRI apparatus.

Because the power source apparatus 1 according to the prior art described above comprises one amplifier (inclusive of the switching power source), it is not free from the drawback that its capacity is not sufficient for outputting a large current. When a linear amplifier is used as the power source for the gradient magnetic field (FIG. 1), for example, a voltage V corresponding to a time change ratio of a current, which is expressed by the following formula, becomes necessary when the inductance Lc of the gradient magnetic field coil 200 is 0.5 mH and an output current IL having a rise time of 0.5 ms and a current value of 400 A is supplied:

$$V = Lc \times dIL/dt = 0.5 \times 10^{-3} \times 400/0.5 \times 10^{-3} = 400V$$

In other words, the amplifier 10 must output a maximum voltage of 400 V, and a voltage of at least 400 V is used as the D.C. voltage source for operating this amplifier 10. Next, when the output current supplied to the coil 200 reaches a steady value of 400 A, the output voltage of the amplifier 2 becomes substantially zero at this time. Therefore, the voltage (400 V) of the D.C. voltage source of the amplifier is lowered inside the amplifier, and the zero output voltage is generated. The loss occurring inside the amplifier this time attains an unrealistic value as expressed by the following equation:

$$400A \times 400V = 160,000W = 160kW$$

In the case of the switching power source 3 (FIG. 2) using the high speed switching devices typified by the MOSFETs, on the other hand, the voltage used is limited by the rated voltage of the switching devices and devices which can be connected to the D.C. voltage source of 400 V have the current capacity of only about 100 A at maximum. For this reason, the output current of 400 A cannot be supplied to such a switching power source when it is used alone.

The current capacity can be of course increased by connecting a plurality of switching power sources in parallel. When the switching power sources are connected in parallel, however, the circulating current between the switching current sources becomes the problem. In other words, when two output current amplifiers 11 and 12 are connected in parallel with the field generating coil 200 as shown in FIG. 4, the sum current of the output current of the output current amplifier 11 and the output current of the output current amplifier 12 is supplied to the field generating coil. Here, no problem occurs if the output voltage V1 of the output current amplifier 11 is exactly equal to the output voltage V2 of the output current amplifier 12. However, when unbalance occurs between the potentials of these output voltages such as when V1>V2, a circulating current Ic' which returns to the output current amplifier 11 through the output current amplifier 12 having a lower potential but without flowing through the field generating coil 200 as the load occurs in the output current of the output current amplifier 11 having a higher potential. Such a circulating current is an ineffective current not supplied to the field coil and moreover, if no resistance exists in the circuit through which the circulating current flows, the current becomes an infinite current and this current exceeds the rated current of the output current amplifier and might destroy the output current amplifier.

As the prior art references associated with the present invention, U.S. Pat. No. 5,017,871 and JP-A-6-47015 propose a power source apparatus which connects a plurality of output current amplifiers to a field generating coil as a load. On the other hand, the power source apparatus described in JP-A-6-47015 combines a plurality of switching power sources with linear amplifiers and connects them in series with the gradient magnetic field coil as the load. To obtain a greater current, however, it is more advantageous to connect the power sources in parallel. The power source apparatus for a NMR imaging system described in U.S. Pat. No. 5,017,871 connects a plurality of linear amplifiers with the field generating coil connected in parallel with a plurality of switching devices, and interposes a capacitor and a diode between a bus line and each linear amplifier. A high voltage can be applied at a high speed by selectively switching the switching devices. In this power source apparatus, the diode connected in series with each linear amplifier causes the current to flow only in one direction and so prevents detour of the current between the amplifiers. However, in order to change the flowing direction of the current passed through the coil in this case, four switching devices connected between the field generating coil and the linear amplifiers must be subjected to change-over control.

When the output current amplifiers are connected in parallel, therefore, a power source apparatus for MRI which can restrict the circulating current by a simple circuit construction, has high response and can obtain a large current has been desired.

The MRI power source apparatus involves another drawback that a current ripple develops. The voltage at the output terminals of the switching power source shown in FIG. 2, for example, becomes the D.C. voltage containing the ripple of the switching frequency shown in FIG. 3. Therefore, the output current IL supplied to the field coil 200 is a D.C. current which slightly contains the ripple having the same frequency as those of VLA and VRA. The ripple of this output current results in the noise of the image in the MRI apparatus, and must be therefore reduced to several milli-amperes in terms of the effective value. To solve this problem, a method which limits the cut-off frequency of the smoothing circuit comprising the reactor and the capacitor and a method which increases the switching frequency of the switches have been employed.

As to the former, however, when the cut-off frequency is lowered, response of the output current to the current command value to be applied to the field generating coil is retarded, so that a high quality image cannot be obtained easily at a high speed. The latter uses switches capable of high speed switching such as MOSFETs and can attain the operation at a frequency of 80 to 100 kHz, for example. As described already, however, the high speed switching devices such as the MOSFETs generally have a withstand voltage of about 500 V and a rated current of about 100 A, and cannot cope with a higher voltage and a greater current capacity.

SUMMARY OF THE INVENTION

It is therefore an object of the present invention to provide a power source apparatus formed by connecting a plurality of output current amplifiers in parallel, which has a large current capacity and high speed response, can output a current having an arbitrary waveform and can moreover solve the problem of a circulating current between the output current amplifiers.

It is another object of the present invention to provide a power source apparatus which has a low ripple current and is therefore suitable for a magnetic field having a high voltage and a large capacity.

It is still another object of the present invention to provide a power source apparatus which can output a low ripple current irrespective of the kind of switching devices used.

It is still another object of the present invention to provide an MRI apparatus equipped with a power source having a large current and high response and capable of supplying a low ripple current to a field generating coil, and capable of coping with high speed imaging and obtaining a high quality image having a reduced noise.

To accomplish the objects described above, the present invention provides a power source apparatus for outputting a current having an arbitrary waveform, which includes a distribution unit for distributing a current command value (A) to be supplied to a load; a plurality of output current amplifiers for supplying output currents corresponding to the current command value (Ai) so distributed, to the load, connected in parallel with the load; a detection unit for detecting an output current (Ii) of each of the output current amplifiers, connected to the output side of the output current amplifiers; and a control unit for independently controlling each output current amplifiers so that the difference between the output current value (Ii) detected by the detection unit and the current command value (Ai) distributed becomes zero.

The power source apparatus according to another embodiment of the present invention includes a distribution unit for distributing a current command value (A) to be supplied to a load; a plurality of output current amplifiers for supplying an output current corresponding to the current command value (Ai) so distributed, to the load, connected in parallel with the load; and a current limit unit for allowing the bidirectional flow of the output current but limiting a circulating current between the output current amplifiers.

The output current amplifier may be any of linear amplifiers comprising an analog circuit in which the input and the output have a proportional relationship, and switching power sources equipped with switching devices, but the switching power source is suitable from the aspects of high speed response and a low loss.

The current limit unit can use resistors or reactors, and can use them in combination. The resistor is inserted between the output side of the output current amplifier and the load or into the circuit of the output current amplifier in series or into at least one of the two output terminals of the output current amplifier. The reactor is inserted between the output side of the output current amplifier and the load. Particularly when the output current amplifier is the switching power source, the reactor is effective for limiting the circulating current due to instantaneous unbalance of the output voltages of the output current amplifiers.

When the output current amplifier comprises the switching power source, the power source apparatus according to another embodiment of the present invention further includes a phase controller and deviates the phases of the switching devices in each switching power source so as to execute driving control.

The MRI apparatus according to the present invention includes the power source apparatus described above as the power source apparatus for each field generating coil.

In the power source apparatus of the present invention having the construction described above, the command value of the output current to be passed through the load is distributed by the distribution unit, the command values so distributed are inputted to a plurality of output current amplifiers, respectively, and the sum of the output currents of the individual output current amplifiers is supplied to the load. Because a plurality of output current amplifiers are disposed in parallel as described above, the output current of the power source apparatus can be increased as a whole even when the current capacity of the single output current amplifier is small or even when the switch withstand voltage of the switching device is low when the output current amplifier comprises the switching power source. Therefore, the power source apparatus can be applied to the field generating coils of the MRI apparatus which need a large current. In the case of the switching power source, the high speed switching devices such as the MOSFETs can be used as the switch, although the current is large as a whole, and the switching frequency can be increased. As a result, the ripple of the output current can be reduced to minimum.

The output current of each output current amplifier is detected, and independent current control is carried out so that the difference between the output current value so detected and the current command value of each output current amplifier becomes zero. Because unbalance of the output currents can be thus prevented, the circulating current from one of a plurality of output current amplifiers connected in parallel to another can be prevented, and an ineffective current is prevented from flowing through routes other than the load. Such a detour of the current can be prevented also by the current limit unit connected to the output side of each output current amplifier.

Each switching power source is operated while the phase is being deviated a little by the control circuit. Therefore, even when each switching power source is operated at a low switching frequency, the ripple contained in the final output current obtained by synthesizing these output currents has a high frequency and the ripple can be made small. Further, because the current contains a low ripple even without using the high speed switching devices such as the MOSFETs, large capacity semiconductor switches such as bipolar transistors, gate turn-off thyristors, insulated gate bipolar transistors (IGBT), and so forth, can be utilized. In this case, a current capacity can be further increased.

The control circuit compares the current command value with the output current of each switching power source and drives the switch so that their difference becomes zero. Accordingly, a desired output current can be obtained always even when each switching power source is operated while the phase thereof is deviated.

When the power source apparatus described above is used as the power source apparatus of the MRI apparatus, it can supply a large current having high response and low ripple waveform to each field generating coil. Therefore, the MRI apparatus can obtain images useful for diagnosis by high speed imaging and particularly because the output having the ultra-low ripple waveform can be obtained, the noise of the images of the MRI apparatus resulting from the ripple can be reduced, and high quality images can be obtained.

According to the present invention described above, a power source apparatus capable of outputting a greater current than a single switching power source can be constituted by disposing a plurality of output current amplifiers in parallel as a power source apparatus, and this power source apparatus is suitable as a power source for supplying an arbitrary large current waveform to the MRI apparatus, etc. According to the present invention, further, individual units for switching the direction of the current supplied to the load can be eliminated by detecting the output current of each of a plurality of output current amplifiers connected in parallel, executing feedback control and connecting a current limit unit for allowing the bidirectional flow of the current such as a resistor or a reactor to the output side. Moreover, this power source apparatus can prevent a circulating current due to unbalance of the output currents of the output current amplifiers.

According to the present invention, a ripple can be reduced and a frequency can be increased by operating a plurality of switching power sources while their phases are deviated from one another. Therefore, the present invention can provide a power source apparatus having a low current ripple for a magnetic field having a high voltage and a large current without using high speed switching devices such as MOSFETs.

BRIEF DESCRIPTION OF THE DRAWINGS

FIG. 12 is a block diagram showing an embodiment of an MRI apparatus using the power source apparatus according to the present invention.

DESCRIPTION OF THE PREFERRED EMBODIMENTS

Figure 1:
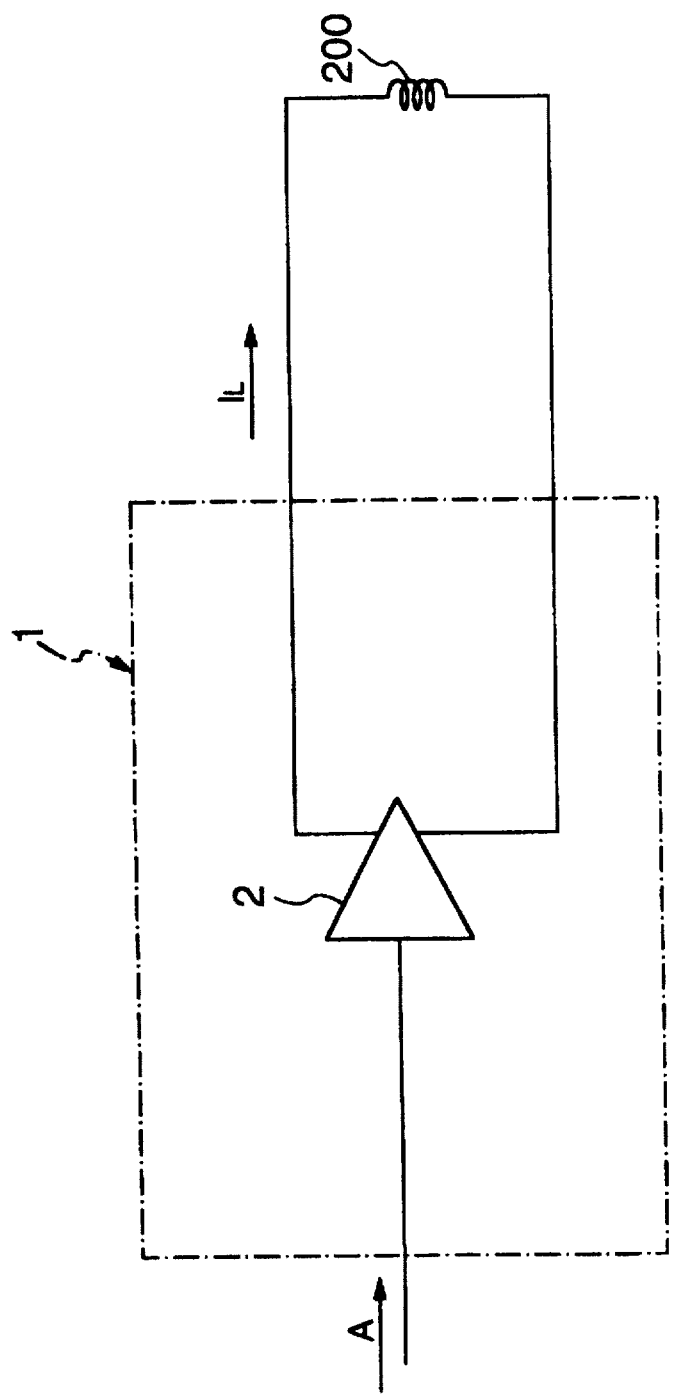
FIG. 1 is a block diagram showing a power source for an MRI apparatus according to the prior art.

Hereinafter, the explanation will be given on the case where the power source apparatus according to the present invention is applied to a gradient magnetic field coil of an MRI apparatus. Incidentally, like reference numerals will be used to identify like constituent elements throughout the drawings.

Figure 5:
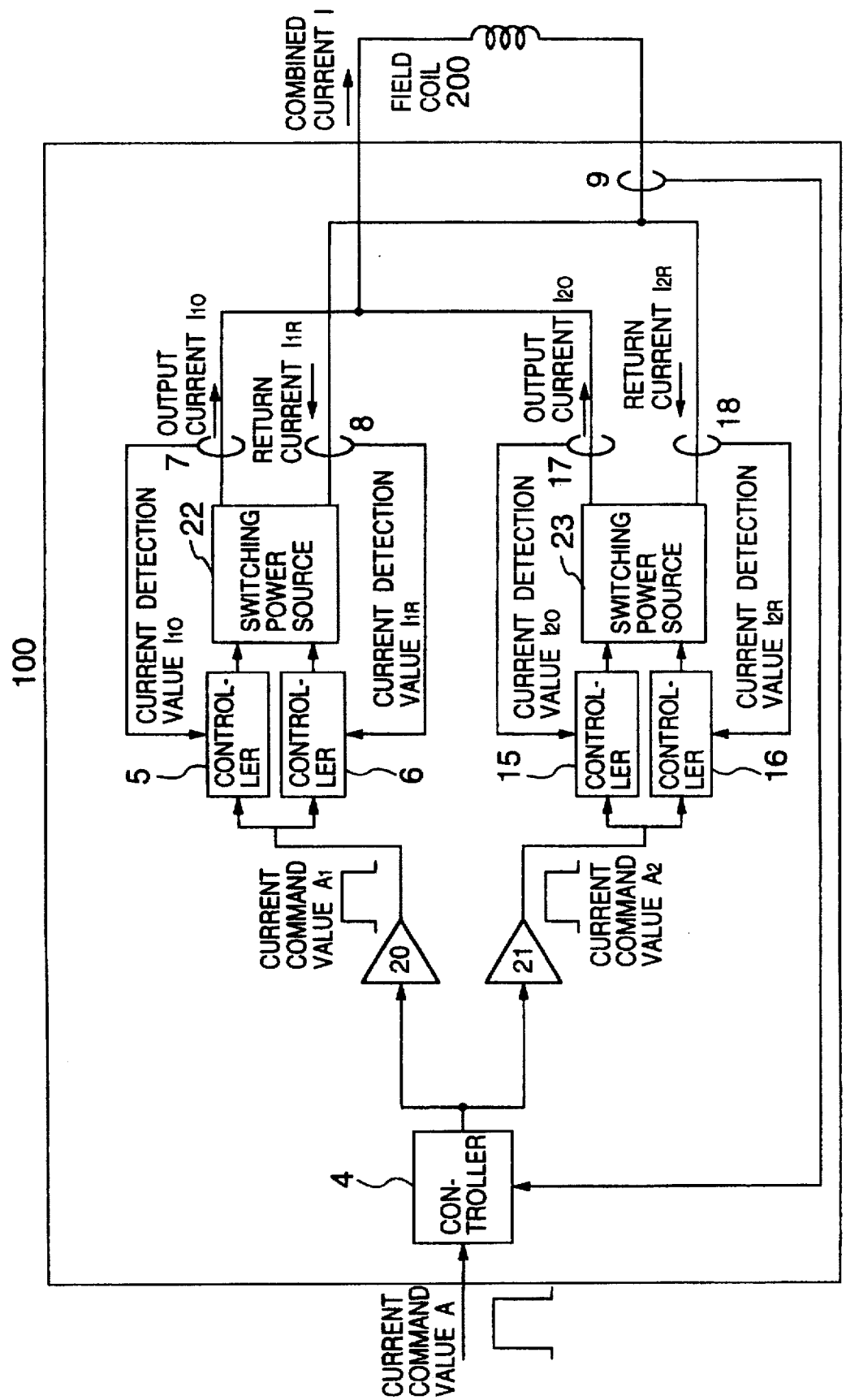
FIG. 5 is a block diagram showing a power source apparatus according to one embodiment of the present invention.

FIG. 5 shows an embodiment of a power source apparatus 100 for an MRI apparatus according to the present invention.

Reference numeral 4 denotes a controller which compares a current command value A with the current flowing actually through a field coil 200 and detected by a current detector 9 and controls distributors 20 and 21 so that the difference of these currents becomes zero.

The distributors 20 and 21 input the output signal of the controller 4 and distribute it to each switching power source.

Reference numeral 5 denotes a controller which compares a current command value A1 outputted from the distributor 20 with an output current I10 outputted from a switching power source 22 and detected by a current detector 7 and controls the switching power source 22 so that the difference of these currents becomes zero.

Reference numeral 6 denotes a controller which compares the current command value A1 outputted from the distributor 20 with a return current I1R outputted from the switching current source 22 and detected by a current detector 8 and controls the switching power source 22 so that the difference of these currents becomes zero.

Reference numeral 15 denotes a controller which compares a current command value A2 outputted from the distributor 21 with an output current I20 outputted from a switching power source 23 and detected by a current detector 17 and controls the switching power source 23 so that the difference of these currents becomes zero.

Reference numeral 16 denotes a controller which compares the current command value A2 outputted from the distributor 21 with a return current I2R outputted from the switching power source 23 and detected by a current detector 18 and controls the switching power source 23 so that the difference of these currents becomes zero.

Reference numeral 22 denotes a switching power source which controls the output current I10 in accordance with the output of the controller 5 and controls the return current I1R in accordance with the output of the controller 6.

Reference numeral 23 denotes a switching power source which controls the output current I20 in accordance with the output of the controller 15 and controls the return current I2R in accordance with the output of the controller 16.

The outputs of the switching power sources 22 and 23 are connected in parallel with each other and a combined current I (=I10+I20=I1R+I2R) is supplied to a field coil 200. This combined current I is detected by the current detector 9 as described above and is inputted to the controller 4.

The power source apparatus having the construction described above divides a desired current command value A as a field coil current by the number of parallel switching power sources and supplies the divided currents as the current command values A1 and A2 of the switching power sources 22 and 23, respectively. The controllers 5 and 6 conduct control so that the output current I10 and the return current I1R of the switching power source 22 are in conformity with the current command value A1, and the controllers 15 and 16 conduct similar control so that the output current I20 and the return current I2R of the switching power source 23 are in conformity with the current command value A2. Therefore, it becomes possible to prevent detour of the current between the switching power sources 22 and 23 and breakage of the power sources 22 and 23.

Further, because the controller 4 conducts control so that the final combined current I is in conformity with the current command value A, the current of the field coil 200 can be reliably controlled without relying on accuracy or variance of the distributors 20 and 21 and the current detectors 7, 8, 17 and 18. In this case, there is the merit that accuracy and variance of these distributors and current detectors are allowable to a certain extent, and economical distributors and current detectors can be used when the number of parallel switching sources is great. Nonetheless, accuracy of only the current detector 9 for detecting the combined current I must be secured sufficiently.

If the switching power sources 22 and 23 are completely independent as will be later described and if the detour current does not flow to the side where feedback control is not made even when both of the output current and the return current are not subjected to feedback control, feedback control may be applied to only one of the output side (5, 7, 15 and 17) and the return side (6, 8, 16 and 18).

Further, if sufficient accuracy can be obtained for the current distributors 20 and 21 and the current detectors 7, 8, 17 and 18, the outer feedback loop comprising the current detector 9 and the controller 4 may be omitted.

Though FIG. 5 shows only two switching power sources for the purpose of simplification of the explanation, a large current can be supplied to the field coil 200 by connecting in parallel a plurality of switching power sources.

The distributor can be accomplished by an operational amplifier, a digital circuit for effecting distribution by the arithmetic operation inside a microprocessor, or a software. Generally, each distributors 20 and 21 divide the current command value by 1/n (n: the number of switching power sources; n=2 in the embodiment shown) and distribute the divided current command value. Incidentally, this division may be made in accordance with power of the switching power sources without dividing the current command value into equal parts.

Figure 6:
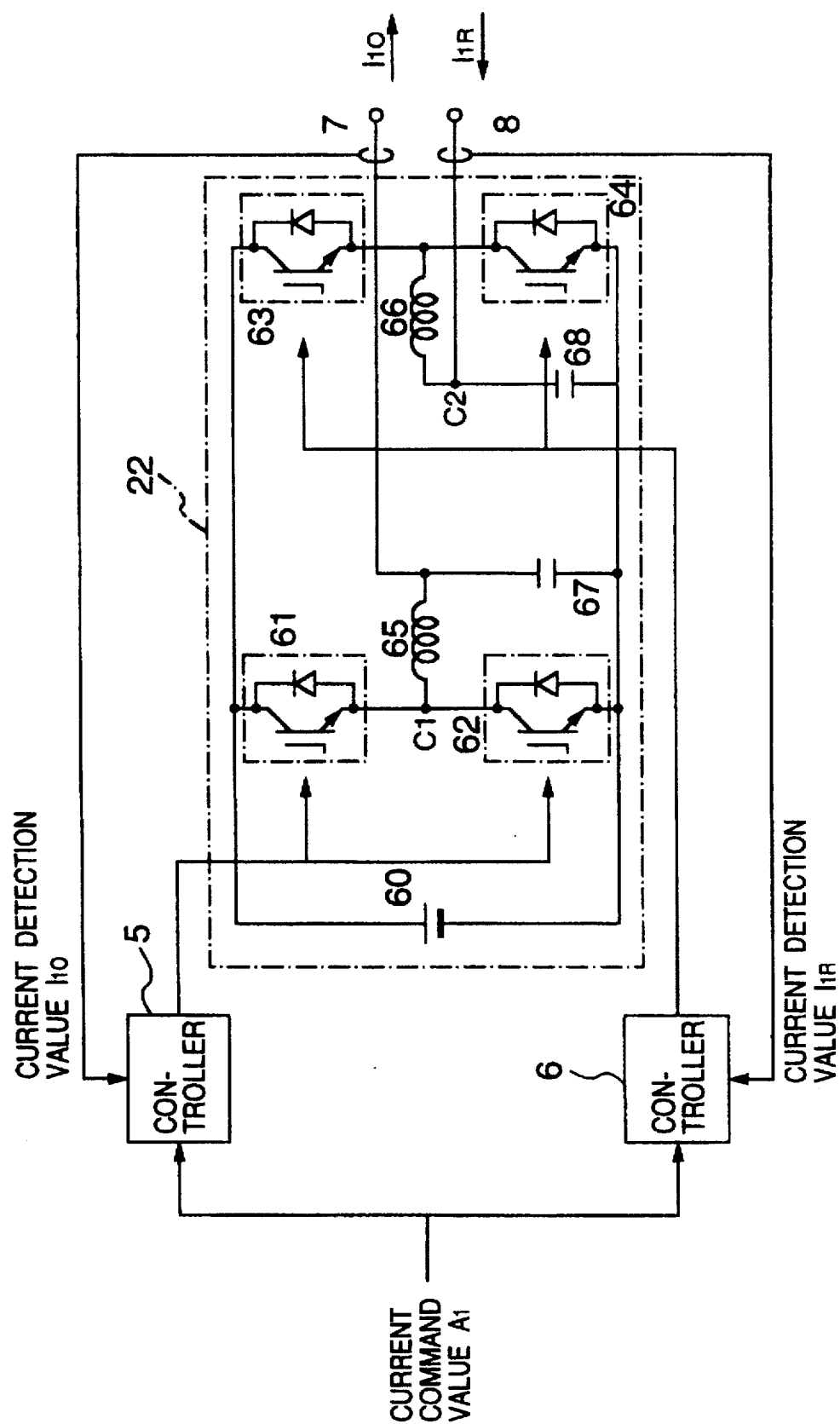
FIG. 6 is a block diagram showing an example of the switching power source used for the power source apparatus shown in FIG. 5.

FIG. 6 is a detailed view of the controllers 5 and 6 and the switching power source 22.

Figure 2:
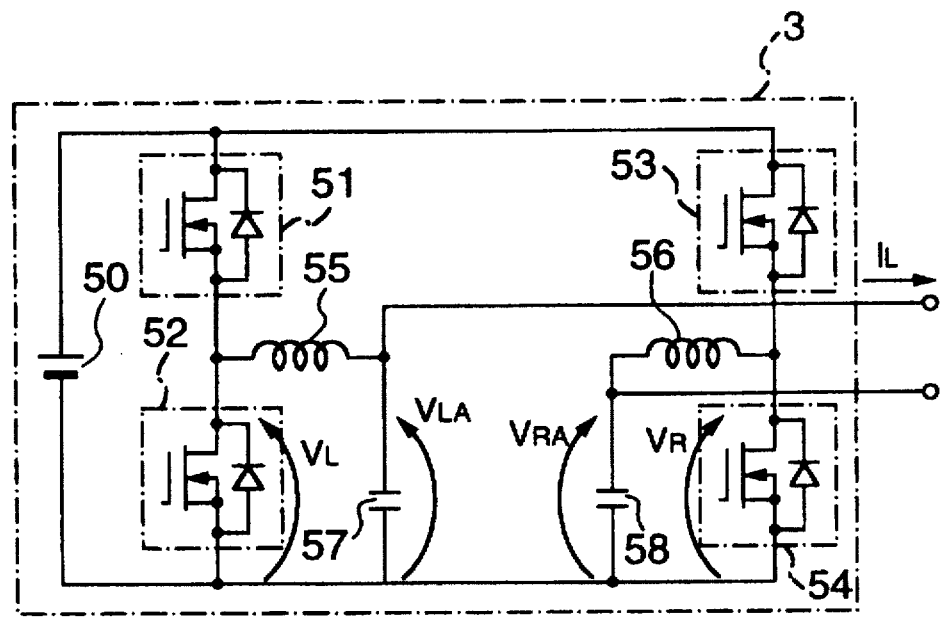
FIG. 2 is a block diagram showing a power source apparatus according to the prior art.
Figure 3:
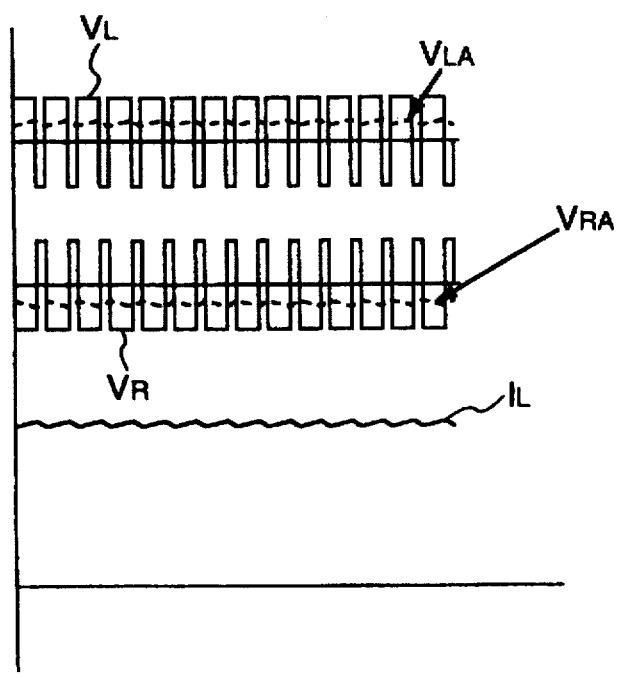
FIG. 3 is a waveform diagram showing switching waveforms of the power source apparatus according to the prior art.

The switching power source 22 (as well as the switching power source 23) is fundamentally the same as the switching power source 3 shown in FIG. 2, and includes, as shown in FIG. 6, a D.C. voltage source 60, switching devices 61 to 64 connected to the positive and negative sides of the D.C.

voltage source 60 and constituting a bridge, and a reactor 65 and a capacitor 67 and a reactor 66 and a capacitor 68 inserted into the junction C1 between the switching devices 61 and 62 of the switching power source 22 and into the junction C2 between the switching devices 63 and 64, for smoothing the voltage on the collector side. Each switching power source 22 (23) is alternately driven in a predetermined cycle so that the switching devices 61 and 64 and the switching devices 62 and 63 are alternately turned on and off. In this instance, the ON time of the switching devices 61 and 64, for example, is elongated while the ON time of the switching devices 62 and 63 are shortened and according to this circuit arrangement, D.C. voltages having mutually different polarities can be obtained at the junction C1 between the switching devices 61 and 62 and at the junction C2 between the switching devices 63 and 64, that is, at the output terminals of the switching power source 22 and eventually, an output current I10 (I20) occurs.

Various switching devices such as thyristors, bipolar transistors, gate turn-off thyristors, MOSFETs, etc, can be used as the switching device but this embodiment uses insulated gate bipolar transistors IGBT having a high withstand voltage and a large current.

Various known current detectors such as dummy resistors, Hall device detectors, etc, can be used as the detector for detecting the output current besides a current transformer.

Turning back again to FIG. 6, the controller 5 controls the switches 61 and 62 on the left side of the switching current source 22 so that the current command value A1 coincides with the output current I10 detected by the current detector 7, and the controller 6 controls the switches 63 and 64 on the right side of the switching power source 22 so that the current command value A1 coincides with the return current I1R detected by the current detector 8.

As described above, the circuit shown in FIG. 6 can control the output current and the return current, respectively. If the D.C. power source 60 inside the switching power source 22 shown in FIG. 5 is completely insulated from the D.C. power source (not shown) inside the switching power source 23 and is independent, the output current I10 supplied from the D.C. power source 60 by the switches 61 and 62 always returns as the same return current I1R to the D.C. power source 60 through the switches 63 and 64. Therefore, it is not necessary to execute feedback control of both of the output current and the return current.

However, when the D.C. power source inside the switching power sources 22 and 23 is made in common so as to simplify the construction of the power circuit, the relation described above is not guaranteed, and both of the output current and the return current must be subjected to feedback control.

In the embodiments described above, the switching power source (full bridge type) comprising one power source (60) and four arms (61, 62, 63 and 64) shown in FIG. 6 has been explained as the example of the output current amplifier. However, the output current amplifier is not limited to this type, but can be constituted by two power sources and two arms (half bridge type switch power source). In the switching power source 22 shown in FIG. 6, the reactor 65 (66) and the capacitor 67 (68) that together constitute a lowpass filter may be omitted. Besides the switching power source described above, a linear amplifier comprising an analog circuit such as a power amplifier in which the input and the output has a proportional relationship may be used as the output current amplifier of the present invention.

Figure 7:
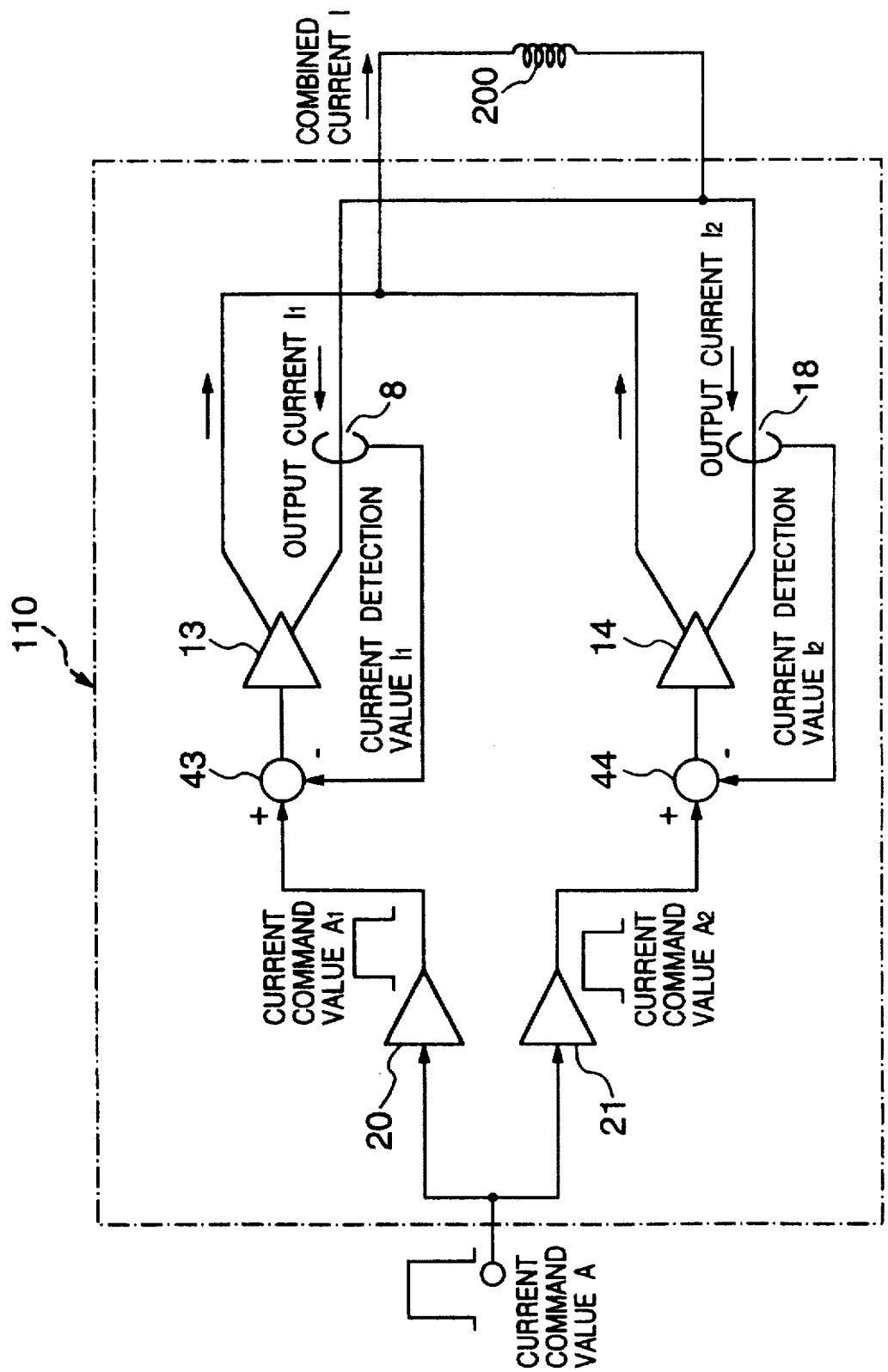
FIG. 7 is a block diagram showing another embodiment of the power source apparatus according to the present invention.

FIG. 7 shows the power source apparatus 110 using the linear amplifier as the output current amplifier. The construction of the detectors 8 and 18 for detecting the output currents of the distributors 20 and 21 and the linear amplifiers is the same as that of the power source apparatus 100 shown in FIG. 5. In this power source apparatus 110, subtracters 43 and 44 are interposed between the distributors 20 and 21 for distributing the current command value A and the linear amplifiers 13 and 14, respectively, and calculate the difference between the detection value from the detectors 8 and 18 and the current command value. The difference value is inputted to the linear amplifiers 13 and 14. These linear amplifiers control the output current so that the difference becomes zero, as current feedback control. Accordingly, the combined current I of the output currents I1 and I2 of the linear amplifiers 13 and 14 coincides with the current command value A and is supplied to the field coil 200. Since the output currents I1 and I2 of the linear amplifiers 13 and 14 satisfy the equation I1=I2 and do not have unbalance, the problem of the circulating current can be solved in the same way as in the embodiment shown in FIG. 5.

Though FIG. 7 shows only two linear amplifiers, three or more linear amplifiers may be of course disposed in parallel and the distribution ratio of the current command value by the distributors can be of course changed in accordance with the number of parallel linear amplifiers.

Figure 8:
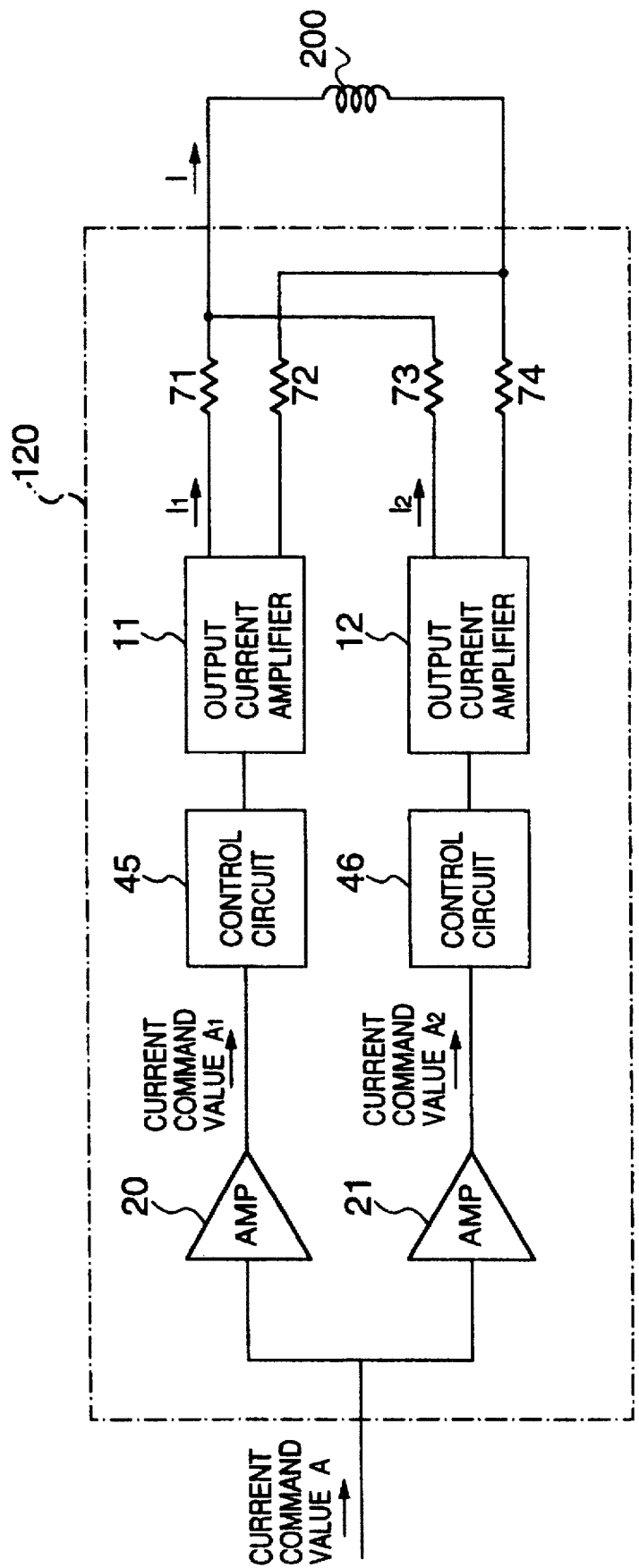
FIG. 8 is a block diagram showing still another embodiment of the power source apparatus according to the present invention.

FIG. 8 shows another embodiment of the present invention which restricts the circulating current by resistors.

The power source apparatus 120 for the MRI apparatus shown in FIG. 8 includes a plurality of output current amplifiers 11 and 12 connected in parallel with the field coil 200, resistors 71 to 74 interposed between each output side of these output current amplifiers 11 and 12 and the field coil 200, distributors 20 and 21 for distributing the current command value A supplied to the field coil 200 and controllers 45 and 46 for controlling the output current amplifiers 11 and 12, respectively.

Though only two output current amplifiers are shown disposed in the drawing to simplify the explanation, a large current can be supplied to the field coil 200 by connecting in parallel a plurality of output current amplifiers. A linear amplifier comprising an analog circuit such as a power amplifier in which the input and the output have a proportional relationship, a switching type amplifier constituted by connecting switching devices such as transistors in the bridge form, a combined system of switching devices with passive devices for resonance, etc, can be used as the output current amplifiers 11 and 12.

The distributors 20 and 21 are shown as operational amplifiers in the drawing. The operational amplifier has an amplification ratio of 1/n time (where n is the number of output current amplifiers; n=2 in the embodiment shown in the drawing).

The operation of the power source apparatus 120 having such a construction will be explained. First, a current command is inputted from a sequencer (not shown) which is a host apparatus to the power source apparatus 120 and generates a current command to be applied to the field coil 200. Each of the distributors 20 and 21 outputs a current command value (A1 or A2) obtained by having the current command value (A) to each output current amplifiers 11 and 12. Voltages (v1 and v2) necessary for outputting output currents (I1 and I2) (I1=I2) corresponding to the current command are outputted from the output terminal of the output current amplifiers 11 and 12 and as a result, the output current (I) as the sum of these currents is outputted from the output terminals of the power source apparatus 120 and is supplied to the field coil 200.

Figure 4:
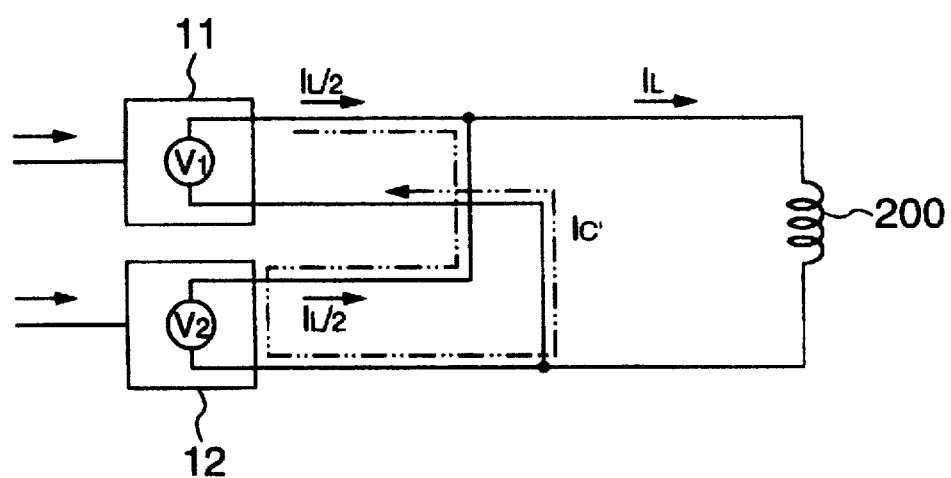
FIG. 4 is an explanatory view useful for explaining the occurrence of a circulating current when output current amplifiers are connected in parallel.

The voltages v1 and v2 of the output terminals of these two output current amplifiers 11 and 12 should be substantially equal to each other but a potential difference such as v1>v2 occurs, even if it is slight, due to variance of the circuit devices and the D.C. power sources. As described already, this potential difference generates the circulating current Ic shown in FIG. 4. However, because the resistors 71 to 74 are inserted between the output current amplifiers 11 and 12 and the field coil 200, the output voltages v1 and v2 of the output current amplifiers 11 and 12 have the following relationship provided that the resistance values of the resistors 71 to 74 are all equal and are Rb:

$$v1 = v2 + 4 \, Rb \times Ic$$

Therefore, $$Ic = (v1 - v2)/4 \, Rb$$

Therefore, the circulating current can be limited to a finite value which is proportional to the difference of the output voltages between the output current amplifiers 11 and 12 and is inversely proportional to the sum of the resistance values. In this way, it becomes possible to prevent the circulating current from exceeding the rated current of the output current amplifiers and from destroying them.

Though the explanation described above is based on the assumption that the resistance values of the resistors 71 to 74 are all equal and are Rb, the resistance values need not always be equal. Further, the resistors need not be inserted to both of two output terminals of each output current amplifier and may be inserted to at least one of them. For example, either one of the resistors 71 and 72 may be inserted to the output current amplifier 11. From the basic object of restricting the circulating current, the resistors necessary for absorbing slight unbalance of the output voltages of a plurality of output current amplifiers need be disposed. Therefore, when n (n: integer of 2 or more) output current amplifiers are connected in parallel, for example, the resistor may be inserted into at least either one of the two output terminals of each of (n-1) output current amplifiers. In the embodiment shown in the drawing wherein two output current amplifiers are connected in parallel, minimum one resistor of the resistors 71 to 74 needs be disposed.

According to the embodiment described above, a plurality of output current amplifiers are connected in parallel with the field coil and the resistors are inserted to the output side of each output current amplifier. Accordingly, even when the current capacity of the output current amplifiers is small, the output current of the power source apparatus can be made great as a whole and moreover, the circulating current between the output current amplifiers can be restricted.

The switching power source 22 shown in FIG. 6 can be used as the output current amplifier, and the switching power source 22 from which the reactors 65 and 66 and the capacitors 67 and 68 are removed can also be used.

In the embodiment explained above, the resistors for restricting the circulating current between the output current amplifiers are inserted between the output current amplifiers and the field coil, but these resistors may be connected inside the circuit of the output current amplifier.

Figure 9:
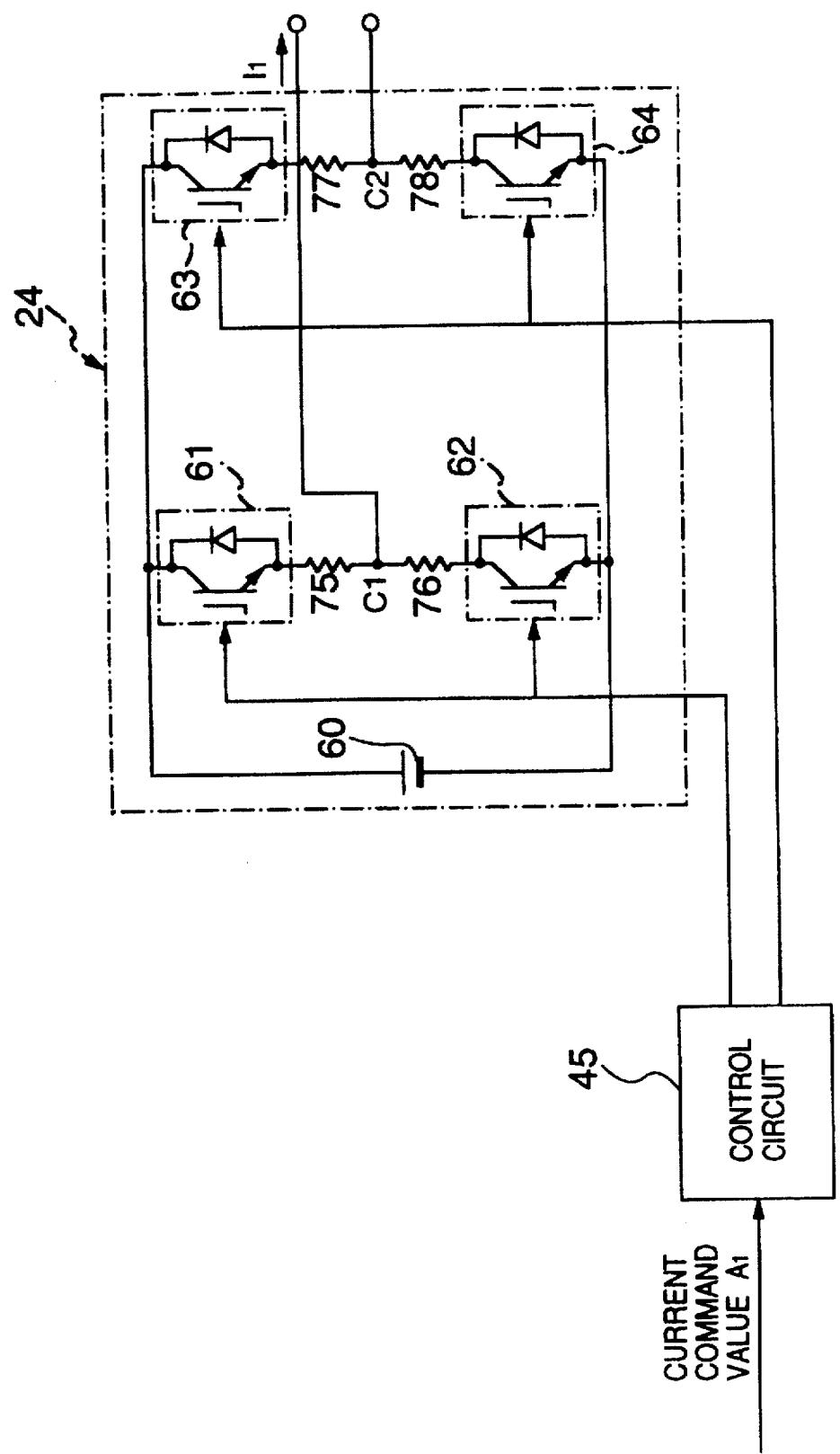
FIG. 9 is a block diagram showing an example of a switching power source used for the power supply apparatus shown in FIG. 8.

FIG. 9 shows an embodiment of the switching power source 24 including resistors that are disposed inside the output current amplifier.

The D.C. power source 60 and the switching devices 61, 62, 63 and 64 are the same as those shown in FIG. 6.

Resistors 75 to 78 are inserted in series between the switching device 61 and the junction C1, between the switching device 62 and the junction C1, between the switching device 63 and the junction C2 and between the switching device 64 and the junction C2 in FIG. 9, respectively.

In the switching power source 24 having such a circuit construction, too, the mean potentials at the junctions C1 and C2 fluctuate due to variance of the switching signal of the switching control circuit 45, variance of the ON voltages of the switching devices and variance of the delay time of switching in the same way as in the switching power source 11 shown in FIG. 8. In this case, too, the circulating current can be limited to a finite value by the resistors 75 to 78 in exactly the same way as when the resistors are inserted between the switching power source and the field coil, and destruction of the switching devices by the circulating current can be thus prevented.

Incidentally, the positions of insertion of the resistors 75 to 78 are not limited to those shown in the drawing but the resistors may be inserted into any of the routes for supplying the output current from the D.C. voltage source 60 on either the output side or the input side with respect to the switching devices. The output current amplifier when the resistors for limiting the circulating current are disposed inside the circuit is not particularly limited to the switching power source shown in FIG. 9, but the switching power source shown in FIG. 6 wherein the low-pass filters 65, 66, 67 and 68 are inserted may be of course employed.

In the embodiments shown in FIGS. 8 and 9, a voltage so develops at both ends of the resistors 71 to 78 inserted for restricting the circulating current as to correspond to the output current. Therefore, each output current can be detected from this voltage by using an insulated amplifier or an operational amplifier. In other words, these resistors operate also as an output current detector for each output current amplifier for monitoring the state of the power source.

Figure 10:
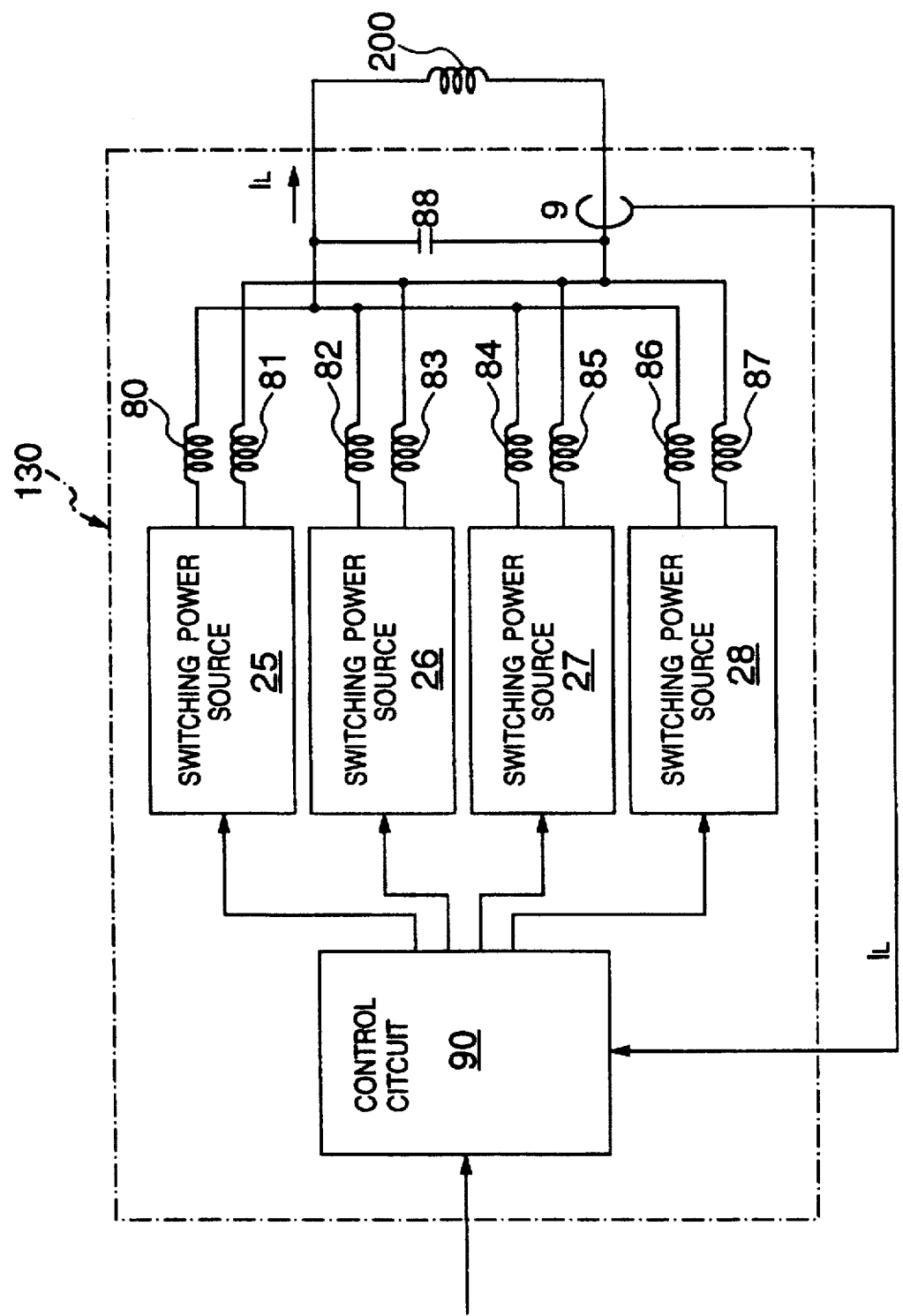
FIG. 10 is a block diagram showing still another embodiment of the power source apparatus according to the present invention.

FIG. 10 shows an embodiment of the power source apparatus for the MRI apparatus using reactors for restricting the circulating current. This power source apparatus 130 includes four switching power sources 25 to 28, reactors 80 to 87 as current limiting units connected to the output side of these switching power sources, respectively, and a control circuit 90 for driving and controlling each switching power source. Each of these switching power sources 25 to 28 is the same as the switching power source 22 shown in FIG. 6 and is connected in parallel with a D.C. power source, not shown. One of the output terminals of each switching power source is connected in common through the reactor 80, 82, 84 and 86, and the other output terminal is connected in common through the reactor 81, 83, 85 and 87 and is connected to the field coil 200 as the load. These reactors 80 to 87 prevent the current from detouring from one of the switching power sources to others when the driving timing of the switching power sources 25 to 28 deviates even slightly, particularly when they are driven while the phases are deviated. Further, the current detector 9 for detecting the current flowing through the field coil 200 is disposed on the output side of the power source apparatus 130 in the same way as in FIG. 5. The control circuit 90 operates as a distributor for distributing the current command value to each switching power source 25 to 28, and the current command value applied to the field coil 200 and the current detection value IL outputted from the current detector 9 are inputted to this control circuit 90. The control circuit 90 drives and controls each switching power source so that their difference becomes zero. The capacitor 88 functions as a filter and converts the output IL of the power source apparatus 130 to the D.C. current. This capacitor 88 may be omitted, whenever required.

In the power source apparatus having the construction described above, each reactor 80 to 87 is connected to the output side of each switching power source 25 to 28. Therefore, when any unbalance develops in the voltages of the output terminals of the switching power sources 25 to 28, the reactors can effectively restrict detour of the current due to this unbalance. In this case, the reactors 80 to 87 are connected to both of the two output terminals of each switching power source, but they need not always be connected to both output terminals but may be connected to one of them. Incidentally, when any difference occurs in the mean value of the voltage value of the output terminals of each switching power source, the circulating current cannot be restricted sufficiently by the reactors alone. In such a case, the resistors 71 to 78 used in the embodiment shown in FIG. 8 or 9 can be used in combination.

The switching power sources 25 to 28 in the embodiment described above can suitably use large capacity semiconductor switches such as IGBTs as the switching devices, and the current ripple of the output current can be reduced particularly by inserting a low-pass filter comprising the combination of the reactor with the capacitor.

Besides the resistors and the reactors described above, diodes connected in reverse parallel (which can be operated also as non-linear resistance), resistors, reactors and their combinations can be used as the current limiting unit so long as they permit the bidirectional flow of the current.

Next, a power source apparatus in which a plurality of switching power sources are connected in parallel with the field coil and which reduces the current ripple will be explained. The construction of this power source apparatus is the same as a whole as the circuit construction shown in FIG. 10, but the control circuit 90 for conducting ON/OFF control of the switching devices of the switching power sources 25 to 28 drives and controls each switching power source while deviating the phase of each switching power source so that the difference between the current command value and the current detection value outputted from the current detector 9 becomes zero.

Figure 11A:
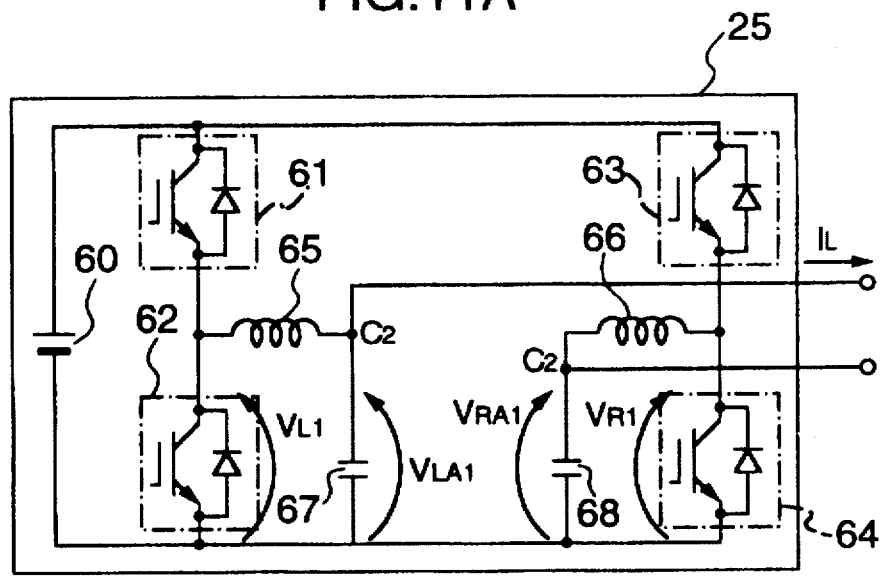
FIG. 11A is a block diagram showing the voltage measurement positions for explaining an example of control where the phase of the switching power source is deviated.

FIG. 11A shows the circuit of the switching power source 25. Since this construction is the same as that of the switching power source 22 shown in FIG. 6, its explanation will be omitted.

Referring to FIG. 11A, symbols VL1 and VR1 represent the voltages of the switching devices 62 and 64 on the collector side as viewed from the neutral point (not shown) of the D.C. power source 60. The voltages VLA1 and VRA1 at the output terminals of the switching power source are obtained by smoothing the voltages VL1 and VR1 by the smoothing circuit (reactor and capacitor), respectively.

Figure 11B:
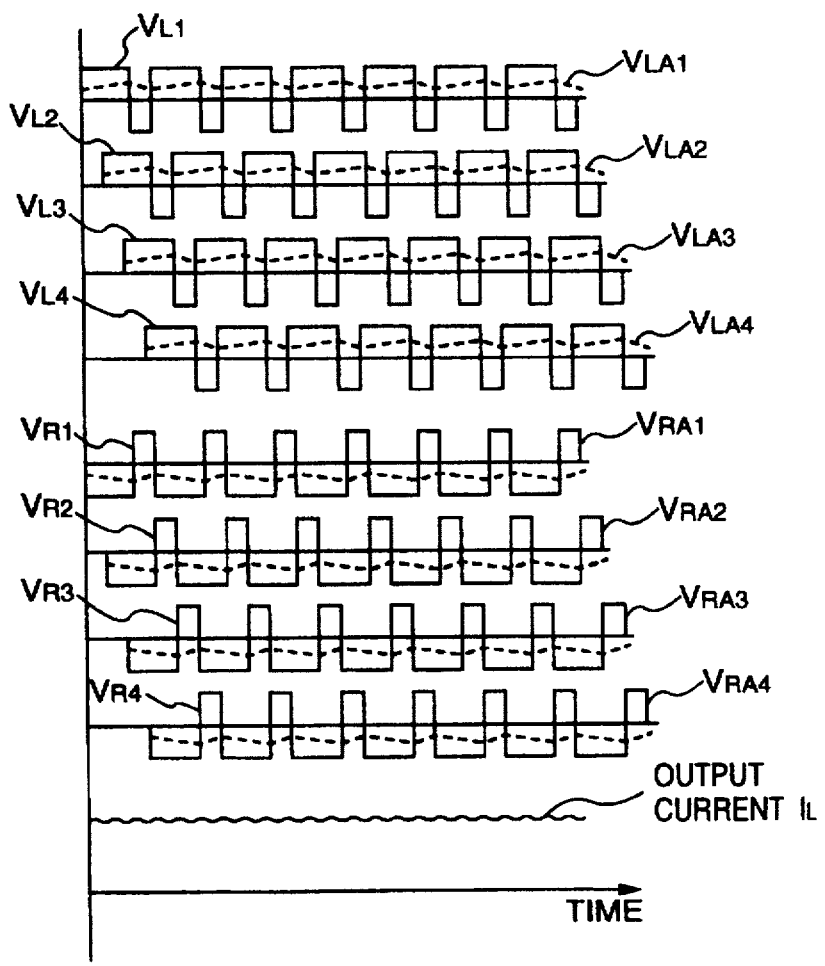
FIG. 11B is a waveform diagram showing the voltages of the switching power sources and is useful for explaining another control example where the phases of the switching power sources are deviated.

In this embodiment, too, each of the switching power sources is connected to the field coil 200 through the reactor, but the switching devices of these switching power sources 25 to 28 are driven by the control circuit 90 in such a manner that the phase is deviated for each switching power source. In this embodiment, four switching power sources are disposed as shown in FIG. 11B and for this reason, the phases are shifted by 90°. Incidentally, the waveforms VL1 to VL4 and VR1 to VR4 indicated by solid lines in the drawing represent the voltages on the collector side of the left switching device 62 of each switching power source, and the waveforms indicated by dash lines represent the voltages VLA1 to VLA4 and VRA1 to VRA4 of the output terminals of each switching power source. To deviate the phase, the control circuit 90 deviates the impression timing of the gate voltage of the switching device of each switching power source 25 to 28, compares the current command value to be applied to the field coil 200 with the current detection value detected by the current detector 9 and controls the voltage applied to the switching device of each switching power source so that their difference becomes zero. Accordingly, even when each switching power source is driven while the phase thereof is deviated, the output current IL of the predetermined current command value is applied to the field coil.

Here, the waveform of the voltage at the output terminals of each switching power source is the D.C. waveform containing the ripple having the same frequency as the switching frequency as shown in FIG. 11B, but because the phases are deviated by 90° from one another, the voltage at the output terminals of the power source apparatus shown in FIG. 10 is converted to a high frequency as a whole and the ripple of the output current IL flowing through the field coil 200 can be reduced. In consequence, even when the frequency is set to the highest frequency for stably operating the switching devices having a high withstand voltage and a large current such as the IGBT, for example, to 20 kHz, the ripple frequency in the practical output can be changed to 80 kHz, and the ripple can be thus reduced.

The embodiment given above represents the case where four switching power sources are disposed in parallel, but the power source apparatus according to the present invention may comprise at least two switching power sources. Therefore, the switching power sources may be added, whenever necessary, so as to increase the number of parallel switching power sources. When the number is increased, a power source apparatus having a greater current can be constituted.

The embodiment shown in FIG. 10 uses the reactors 80 to 87 as the current limiting means for preventing the inflow of the output current of one switching power source to the other by connecting the switching power sources 25 to 28 in parallel. However, the current limiting unit may use the resistors or the diodes in place of the reactors, or their combination. Though the reactors are shown connected to both output terminals, they need not always be connected to both output terminals but may be connected to one of them.

In the embodiment described above, the phases of the switches of the switching power sources are equi-distantly shifted, but the shift interval need not always be equidistant but may be unequal. Furthermore, the phase of some switching power sources may be the same. When the phases are shifted, the frequency of the ripple of the output current of the power source apparatus can be increased. Therefore, devices having a high withstand voltage and a large current such as IGBTs, whose stable operating frequency is relatively low, can be used as the switching devices and eventually, a large capacity can be accomplished. When high speed switching devices such as MOSFETs are used, the frequency of the ripple can be further increased.

Control means for shifting the driving phases of the switching power sources is not limited to the power source having the construction shown in FIG. 10, and those shown in FIGS. 5, 8 and 9 may also be employed.

As still another embodiment of the present invention, the control method which feeds back the output current value of the output current amplifier shown in FIGS. 5 and 7 may be combined with the method which inserts the resistor or the reactor to the output line of the output current amplifier shown in FIGS. 8 to 10. In such a case, when the output current amplifier is the switching power source, an output having a low ripple can be obtained by driving and controlling each switching power source while the phase thereof is shifted.

FIG. 12 shows an embodiment of the MRI apparatus using the power source apparatus according to the present invention as the power source for a field generating coil.

In the MRI apparatus shown in FIG. 12, a current is first supplied from a static magnetic field power source apparatus 114 to a static magnetic field magnet 115 such as a normal or superconducting magnet, and an inspection object is placed inside a strong static magnetic field. Next, a radio frequency (RF) current is supplied from an RF magnetic field power source apparatus 112 to an irradiation coil 118 interposed between the inspection object and the static magnetic field magnet so as to irradiate the RF magnetic field to the inspection object. Protons inside the inspection object, for example, resonate with this RF magnetic field and emit electromagnetic waves having a frequency corresponding to the field intensity at positions, at which the protons exist, even after the irradiation is completed. The electromagnetic waves so emitted are detected by a detection coil 117 and detection signals are inputted to an RF receiver 113. An image processor 119 constitutes and displays an image representing the density of the protons of the inspection object on the basis of the output of the RF receiver 113.

To acquire the positions of the protons for irradiating the RF electromagnetic waves, a gradient magnetic field power source apparatus 111 overlaps another dynamic magnetic field with the static magnetic field and generates a gradient magnetic field. In other words, it utilizes the properties that the frequency of the electromagnetic wave emitted from the proton is proportional to the field intensity.

The power source apparatus according to the present invention is used for these static magnetic field power source apparatus 114, RF magnetic field power source apparatus 112 and gradient magnetic field power source apparatus 111 capable of supplying highly accurately a large current.

The present invention is not particularly limited to each of the fore-going embodiments but embraces various changes and modifications within the scope of the appended claims.

We claim:

1. A power source apparatus comprising:
   a plurality of bidirectional current supply means connected in parallel with a load;
   means for distributing a first current command value instructing a current value supplied to said load to a plurality of said current supply means;
   first control means for controlling each of said current supply means so that an output current corresponding to a distributed second current value is supplied to said load; and
   means for preventing a circulating current flowing between a plurality of said current supply means.

2. A power source apparatus according to claim 1, wherein said current supply means include linear amplifiers.

3. A power source apparatus according to claim 1, wherein said current supply means include a switching power source equipped with a switching device.

4. A power source apparatus according to claim 3, wherein said first control means includes means for driving at least a part of switching power sources of said current supply means at different phases.

5. A power source apparatus according to claim 1, wherein said means for preventing the circulating current includes:
   detection means for detecting a current flowing through said load; and
   means for feeding back the current value detected by said detection means to said first control means; and
   wherein said first control means includes means for controlling each of said current supply means so that the difference between the current value detected and said first current command value becomes zero.

6. A power source apparatus according to claim 5, wherein said current supply means include a switching power source equipped with a switching device.

7. A power source apparatus according to claim 6, wherein said first control means includes means for driving at least a part of switching power sources of said current supply means at different phases.

8. A power source apparatus according to claim 6, wherein said means for preventing the circulating current further includes current limiting means connected in series with an output line of said current supply means.

9. A power source apparatus according to claim 8, wherein said current limiting means includes reactors.

10. A power source apparatus according to claim 8, wherein said current limiting means includes resistors.

11. A power source apparatus according to claim 8, wherein, when n (n: integer of 2 or more) switching power sources are connected in parallel, said means for preventing the circulating current includes current limiting means connected to at least one of the two output lines of each of (n−1) switching power sources.

12. A power source apparatus comprising:
   a plurality of current supply means connected in parallel with a load;
   means for distributing a first current command value instructing a current value supplied to said load to a plurality of said current supply means;
   first control means for controlling each of said current supply means so that an output current corresponding to a distributed second current value is supplied to said load; and
   means for preventing a circulating current flowing between a plurality of said current supply means;
   wherein said means for preventing the circulating current includes:
      first detection means for detecting the output current from each of said current supply means; and
      means for feeding back the current value detected by said first detection means to said first control means; and
      wherein said first control means includes means for controlling each of said current supply means so that the difference between the current value detected by said first detection means and said second current command value becomes zero.

13. A power source apparatus according to claim 12, wherein said means for preventing the circulating current includes:
   second detection means for detecting a current flowing through said load; and
   second control means for controlling said distribution means so that the difference between the current value detected by said second detection means and said first current command value becomes zero.

14. A power source apparatus according to claim 12, wherein said first detection means includes means for detecting a current flowing through said load from each of said current supply means.

15. A power source apparatus according to claim 12, wherein said first detection means includes means for detecting a current returning from said load to each of said current supply means.

16. A power source apparatus according to claim 12, wherein said first detection means includes:
   means for detecting a current flowing through said load from each of said current supply means; and
   means for detecting a current returning from said load to each of said current supply means.

17. A power source apparatus comprising:
   a plurality of current supply means connected in parallel with a load;
   means for distributing a first current command value instructing a current value supplied to said load to a plurality of said current supply means;
   first control means for controlling each of said current supply means so that an output current corresponding to a distributed second current value is supplied to said load; and
   means for preventing a circulating current flowing between a plurality of said current supply means;
   wherein said means for preventing the circulating current includes current limiting means connected in series with an output line of said current supply means.

18. A power source apparatus according to claim 17, wherein, when n (n: integer of 2 or more) current supply means are connected in parallel, said means for preventing the circulating current includes current limiting means connected in series with at least one of the two output lines of each of (n−1) current supply means.

19. A power source apparatus according to claim 17, wherein said current limiting means includes resistors.

20. A power source apparatus according to claim 17, wherein said current limiting means includes reactors.

21. A power source apparatus comprising:
   means for distributing a first current command value instructing a current to be supplied to a load, to output current amplifiers;
   a plurality of said output current amplifiers connected in parallel with said load, for supplying an output current corresponding to a distributed second current value to said load;
   first detection means connected to the output side of each of said output current amplifiers, for detecting the output current of each of said output current amplifiers; and
   control means for independently controlling said output current amplifiers so that the difference between the output current value detected by said first detection means and said second current command value becomes zero.

22. A power source apparatus according to claim 21, further comprising:
   second detection means for detecting a current flowing through said load; and
   means for controlling said distribution means so that the current value detected by said second detection means and said first current command value becomes zero.

23. A power source apparatus according to claim 21, wherein said output current amplifiers include a switching power source equipped with a switching device.

24. A power source apparatus according to claim 23, wherein said control means includes means for driving at least a part of switching power sources of said output current amplifiers at different phases.

25. A power source apparatus according to claim 21, wherein said output current amplifiers are bidirectional output current amplifiers.

26. A power source apparatus comprising:
   means for distributing a first current command value instructing a current to be supplied to a load, to output current amplifiers;
   a plurality of said output current amplifiers connected in parallel with said load, for supplying an output current corresponding to a distributed second current command value to said load; and
   current limiting means for allowing a bidirectional flow of said output current, and restricting a circulating current between said output current amplifiers.

27. A power source apparatus according to claim 26, wherein said output current amplifiers include a switching power source equipped with a switching device.

28. A power source apparatus according to claim 27, wherein said control means includes means for driving at least a part of switching power sources of said output current amplifiers at different phases.

29. A power source apparatus according to claim 26, wherein said current limiting means includes resistors inserted to an output line of said output current amplifiers.

30. A power source apparatus according to claim 26, wherein said current limiting means includes reactors inserted to an output line of said output current amplifiers.

31. A power source apparatus according to claim 26, further comprising:
   detection means for detecting a current flowing through said load; and
   means for controlling each of said output current amplifiers so that the difference between the current value detected by said detection means and said first current command value becomes zero.

32. A power source apparatus according to claim 26, wherein said output current amplifiers are bidirectional output current amplifiers.

33. An MRI apparatus comprising:
   static magnetic field generation means;
   gradient magnetic field generation means;
   radio frequency signal generation means;
   NMR signal detection means; and
   image processing means;
   wherein at least one of said static magnetic field generation means, said gradient magnetic field generation means, and said radio frequency signal generation means includes a power source apparatus according to claim 1, 21, or 26.

* * * * *